United States Patent [19]

Kiyozuka

[11] 4,382,197

[45] May 3, 1983

[54] LOGIC HAVING INHIBIT MEAN PREVENTING ERRONEOUS OPERATION CIRCUIT

[75] Inventor: Noboru Kiyozuka, Tokyo, Japan

[73] Assignee: Nippon Electric Co., Ltd., Tokyo, Japan

[21] Appl. No.: 173,540

[22] Filed: Jul. 30, 1980

[30] Foreign Application Priority Data

Jul. 31, 1979 [JP] Japan .................. 54-97802

[51] Int. Cl.³ .............................................. H03K 3/26
[52] U.S. Cl. ................................. 307/470; 307/456; 307/270; 307/317 R
[58] Field of Search ............. 307/456, 475, 446, 470, 307/270, 317, 445, 242, 460

[56] References Cited

U.S. PATENT DOCUMENTS

| | | | |
|---|---|---|---|
| 3,191,067 | 6/1965 | Zimmerman | 307/242 |
| 3,555,294 | 1/1971 | Treadway | 307/317 |
| 3,806,736 | 4/1974 | Wilhelm | 307/455 |
| 4,045,690 | 8/1977 | Tam | 307/260 |
| 4,251,742 | 2/1981 | Beelitz | 307/270 |

*Primary Examiner*—Stanley D. Miller
*Assistant Examiner*—B. P. Davis
*Attorney, Agent, or Firm*—Sughrue, Mion, Zinn, Macpeak and Seas

[57] ABSTRACT

A logic circuit operable without erroneous operation is disclosed. The logic circuit comprises a first and a second switching transistor operating in response to the same signal, a first logic gate including an input transistor receiving a signal derived from the first switching transistor and a second logic gate receiving a signal derived from the second switching signal, in which the signal derived from the first switching transistor is independently fed to the first logic gate.

9 Claims, 6 Drawing Figures

(a)　　　(b)　　　(c)

LOGIC HAVING INHIBIT MEAN PREVENTING ERRONEOUS OPERATION CIRCUIT

BACKGROUND OF THE INVENTION

1. Field of the Invention

The present invention relates to a logic circuit and, more particularly, to a differential input type logic circuit.

2. Description of the Prior Art

A differential input type logic circuit can be operated at a high speed and is widely used. This type logic circuit is basically constructed by a pair of transistors commonly connected at their emitters with a constant current circuit such that one of the transistors has its base supplied with an input signal while the other transistor has its base supplied with a reference voltage. In this instance, a constant voltage, which is generated by a constant current circuit or the like, is used as that reference voltage. In order to ensure a large noise margin, the use of the differential input type logic circuit in which the level of that reference voltage is controlled in accordance with the input signal has recently been begun. In this differential input type logic circuit, moreover, a circuit connection is established between the collector of the transistor having its base supplied with the input signal and the base of the transistor supplied with the reference voltage. In such logic circuit, however, when the input signal is changed, for instance, from a high level to a low level, the transistor supplied with that reference voltage is rendered conductive so that the output from the collector thereof becomes a low level. At this time, the output level from the collector is transiently undershot by the reflection in the circuit and certain wirings or the like so that it is shifted to a level abnormally lower than a specified low level. The abnormal level due to the undershoot is transmitted to the collector of the aforementioned transistor which is supplied with the input signal through the circuit connection, so that the output level which should be high is shifted to the low level in a transient manner thereby to invite the drawback that the logic or derive circuit of the next stage undergoes an erroneous operation.

This drawback is not peculiar to the differential input type logic circuit but is similarly experienced even in case a plurality of gate circuits are driven by the level of the collector of the transistor having its base supplied with the input signal. This is because the abnormal level due to the undershoot in a certain gate circuit is also transmitted to the other gate circuits.

SUMMARY OF THE INVENTION

It is therefore an object of the present invention to provide a logic circuit which is stable in its operations without any erroneous operation.

According to the present invention, there is provided a logic circuit comprising a plurality of logic gates, at least one of which is a base input type receiving a signal at its base, are driven by one signal generated from a signal generating circuit, characterized in that the one signal is applied to a plurality of switching transistors which have their bases connected in parallel so that they accomplish the same switching operations in response to the one signal; and one switched signal signal derived from one of switching transistors is independently supplied to the base input type gate while the logic gate or gates other than the base input type receive other switched signal derived from the remaining switching transistor.

According to the present invention, there is also provided a balance type drive circuit comprising a pair of transistors having their emitters connected commonly with a constant current source, one of the pair of transistors having a base connected with a reference potential source and the other of the pair of the transistors having a base supplied with an input signal, at least two base input type logic gates, each of the logic gates receiving the signals from the respective collectors of the pair of transistors respectively, a third transistor having a base and an emitter connected to the base and the emitter of the one of the pair of transistor, respectively; and means for blocking the base drive current of the other transistor, the blocking means being connected between the collector of the third transistor and the reference potential source.

According to the present invention, there is provided a logic circuit comprising a current source, a first and a second transistors, emitters of the first and second transistors being coupled to the current source in common, first means for operatively supplying a base of the first transistor with a reference voltage, a value of the reference voltage being capable of making the first transistor conductive, second means responsive to a conducting state of the second transistor for inhibiting the first means from supplying the reference voltage thereby to make the first transistor non-conducting, a third transistor having an emitter and a base respectively coupled to the emitter and the base of the second transistor, third means responsive to an input signal for supplying the base of the second and third transistors with a switching signal, a first logic circuit controlled by the conducting state of the third transistor, and a second logic circuit controlled by the conducting state of the first transistor.

According to the present invention, there is also provided a logic circuit comprising an input terminal, a first switching transistor, a second switching transistor, means coupled to the input terminal for supplying bases of the first and second switching transistors with a logic signal, a first logic gate including an input transistor receiving a signal derived from the first switching transistor at its base, and a second logic gate receiving a signal derived from the second switching transistor.

DESCRIPTION OF THE PREFERRED EMBODIMENTS

Figure 1:
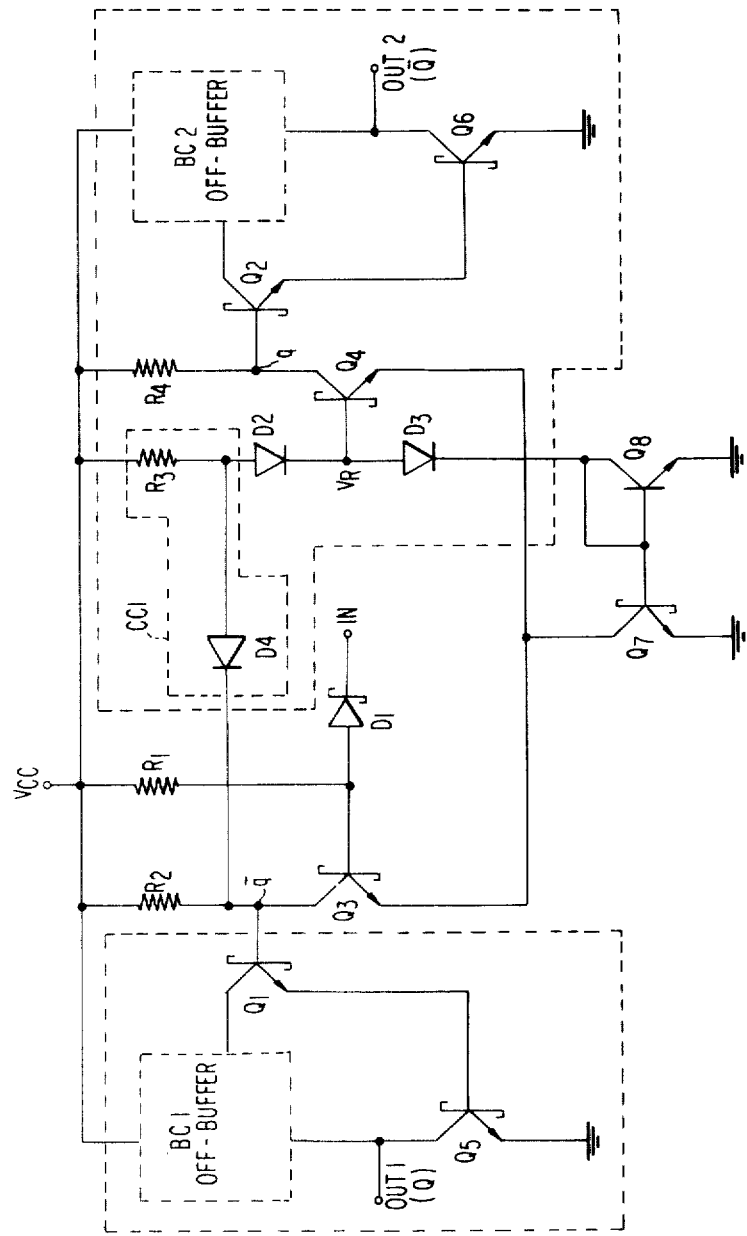
FIG. 1 is a diagram showing one example of a differential input type logic circuit according to the prior art.

A differential input type logic circuit according to the prior art will now be described with reference to FIG. 1.

The differential input circuit essentially made of transistors Q3 and Q4, in which a reference voltage $V_R$ is generated by a constant current circuit including a transistor Q8, produces true and complementary outputs q and $\bar{q}$. The outputs $\bar{q}$ and q are then shifted in level by TTL circuits made of transistors Q1, Q5 and an off-buffer BC1; and transistors Q2, Q6 and an off-buffer BC2, to generate in-phase and anti-phase outputs Q and $\bar{Q}$ from an input signal IN. Moreover, in order to block the base drive current of the transistor Q4 thereby to render the same non-conductive simultaneously when the transistor Q3 is rendered conductive, a drive current blocking element, i.e., a diode D4 is connected between the base of the transistor Q4 and the collector of the transistor Q3.

The operations of the circuit thus constructed will be described in the following.

When a High ("H") level signal is fed to the input IN, the transistor Q3 is rendered conductive to block the base current to the transistor Q4 so that the transistor Q4 is rendered non-conductive. As a result, the transistors Q1 and Q5 are rendered non-conductive so that a "H" level is established at the output Q while a Low ("L") level is established at the output $\bar{Q}$.

On the other hand, when an "L" level signal is fed to the input IN, the transistor Q3 and the diode D4 are rendered cut-off so that the transistor Q4 is rendered conductive by the reference voltage $V_R$. As a result, the transistors Q1 and Q5 are rendered conductive so that an "L" level is established at the output Q while the transistors Q2 and Q6 are rendered non-conductive so that an "H" level is established at the output $\bar{Q}$.

If the "L" level of the output Q is reduced to an abnormal potential $V_x$ lower than 0 volts by signal reflection or like in the circuit when the "L" level is supplied to the input IN so that the "L" level and the "H" level are established at the outputs Q and $\bar{Q}$, respectively, the level reduction in the output Q results in the reduction in the collector potential of the transistor Q3 through base-collector potential of the transistor Q5 and the base-emitter potential of the transistor Q1 thereby to render the diode D4 conductive. As a result, there arises an erroneous operation that the transistor Q4 is rendered non-conductive so that the potential at the output $\bar{Q}$ which should be at the "H" level by that time is reduced and, still the worse, is inverted to the "L" level.

Figure 5:
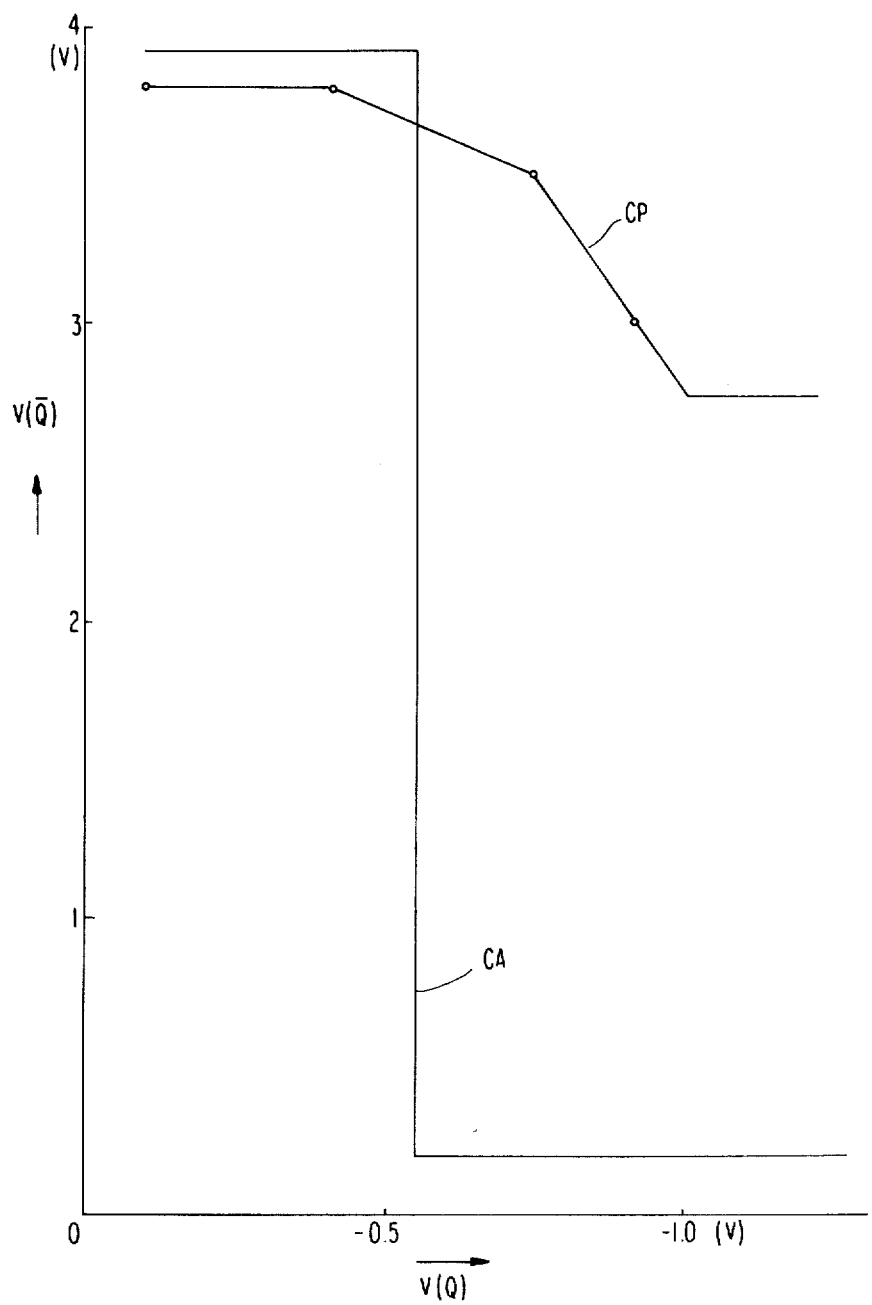
FIG. 5 is a graphical presentation illustrating the input and output characteristics of the circuits shown in FIGS. 1 and 3.

For Example, as shown in a characteristic curve CA in FIG. 5, if the potential V(Q) of the output Q of the circuit under consideration becomes lower than a negative value of −0.5 Volts due to the undershoot, the potential V($\bar{Q}$) of the output $\bar{Q}$ is inverted.

Another conventional logic circuit will be described with reference to FIG. 2, in which there is shown an example of the conventional circuit for driving a plurality of logic gates G1–G3 by a single signal derived from a signal generating circuit SG. In order to facilitate the explanation, the logic gates G1–G3 have Schottky TTL structures. The gate G1 is base input type which receive a signal at a base of an input transistor while the Gates G2 and G3 are not base input type but e.g. emitter input type.

Figure 2:
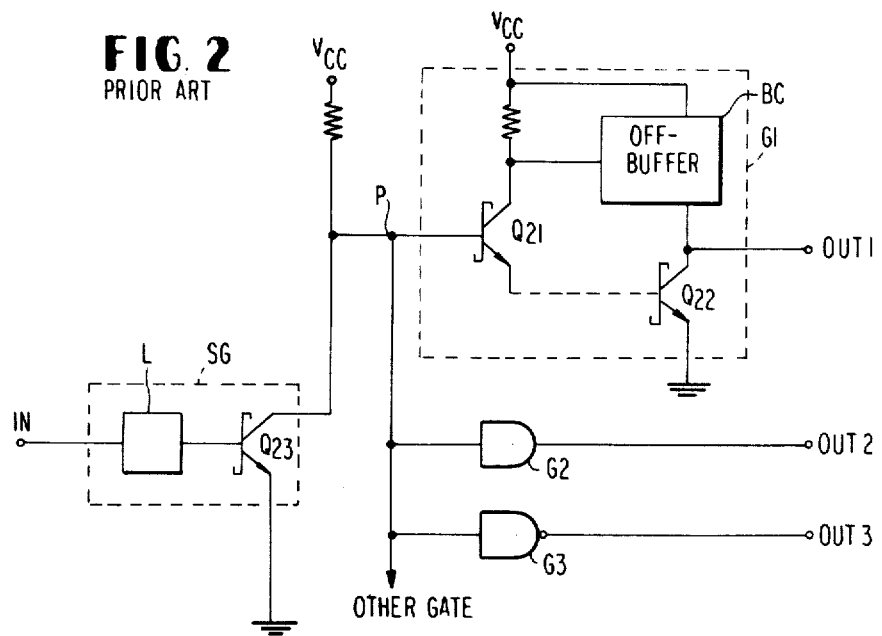
FIG. 2 is a diagram showing another logic circuit according to the prior art.

In FIG. 2, explanation will be made on the case, in which the switching transistor Q23 of the signal generating circuit SG including a logic portion L responsive to an input signal IN for controlling the transistor Q23, is rendered non-conductive so that the potential $V_p$ at a point p becomes high to drive gates G1 to G3 disposed at the next stage. Then, the output OUT1 of the gate G1 is at a low level, the output OUT2 of the gate G2 is at a high level, and the output OUT 3 of the gate G3 is at a low level.

At this time, if the low level of the output OUT1 of the gate G1 having its base input terminal i.e. a base of the transistor Q21 connected directly with the point p is reduced to the abnormal potential $V_x$ lower than the output low level $V_{OL}$ or 0 volts by a certain cause (such as the undershoot by the reflection of signal), the base potential of the output transistor Q22 of the gate G1 is clamped at the potential of ($V_x$ + Vclamp) Volts by the action of a Schottky clamp diode which is connected between the base and collector. (In this instance, Vclamp indicates the voltage at which the Schottky clamp diode of the transistor Q22 is rendered conductive.)

This base potential is transmitted to the point p through the base-emitter voltage $V_{BE}$ of the transistor Q21, which is disposed on the pre-stage of the transistor Q22, thereby to reduce the potential at the point p by a value of about $[V_{BE}(Q_{22}) - (V_x + Vclamp)]$ Volts in comparison with the usual case. At this time, if the input threshold voltages of the logic gates G2 and G3 are within the potential change of the aforementioned point p, the gates G2 and G3 recognize the level at the point p as a low level, after the potential at the point p is reduced because of the aforementioned cause, so that the respective output levels of the gates G2 and G3 are inverted.

As has been understood from the description thus far made, the conventional circuit has the drawback that when the low levels of the logic gates of the base input type are reduced to the abnormal potential $V_x$, then this potential $V_x$ exerts influences upon the outputs of the other gates thereby to invite the erroneous operations.

Now, a first embodiment of the present invention will be described with reference to FIG. 3.

Figure 3:
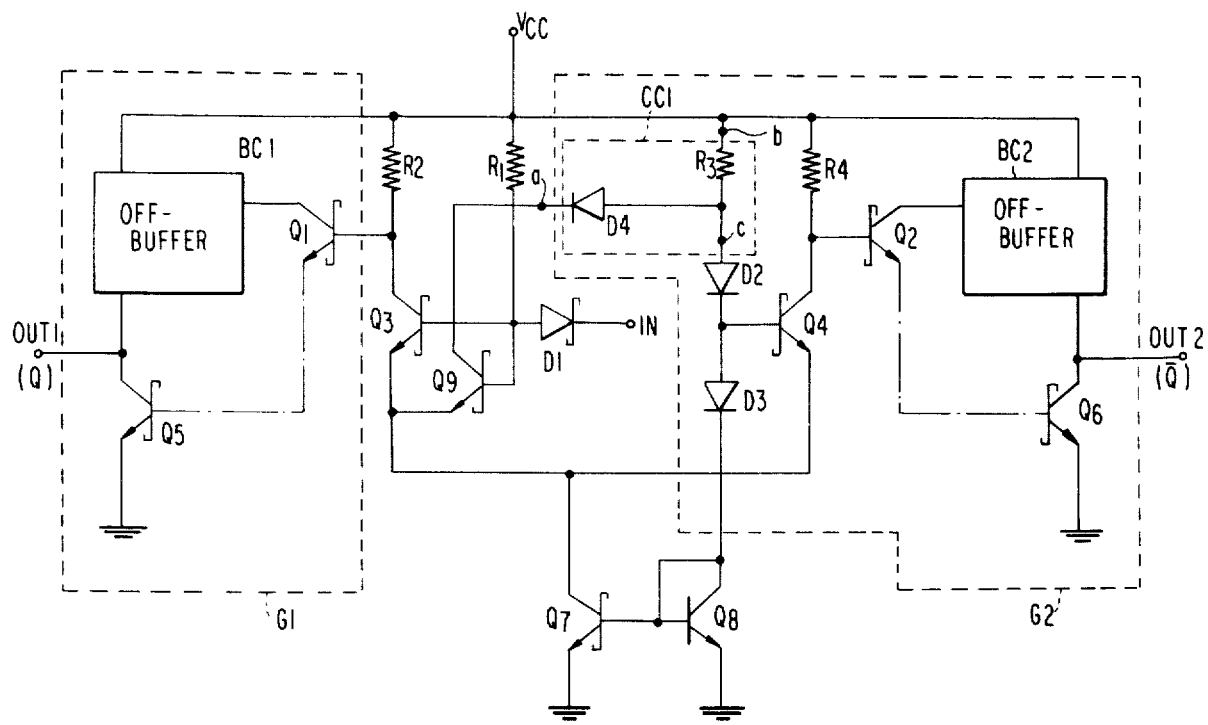
FIG. 3 is a diagram showing a logic circuit according to one embodiment of the present invention.

In FIG. 3, the diode D4 for blocking the drive current has its cathode connected to a collector of a transistor Q9 which has its base and emitter respectively connected to the base and emitter of the transistor Q3. Even if the collector potential of the transistor Q3 is reduced in response to the generation of the abnormal potential $V_x$ at the output OUT1, the diode D4 is left non-conductive so that the "H" level of the output $\bar{Q}$ can be maintained while keeping the transistor Q4 conductive.

As has been described hereinbefore, according to the present invention, in a balance type drive circuit which is constructed of a differential circuit having a drive current bloking element and a constant current circuit and TTL circuits for setting the respective output levels in response to the respective complementary outputs, even if an abnormal potential drop is established at the output which is preset at the "L" level, the resultant influences are not exerted upon the "H" level of the other output so that any erroneous operation can be prevented.

Figure 4:
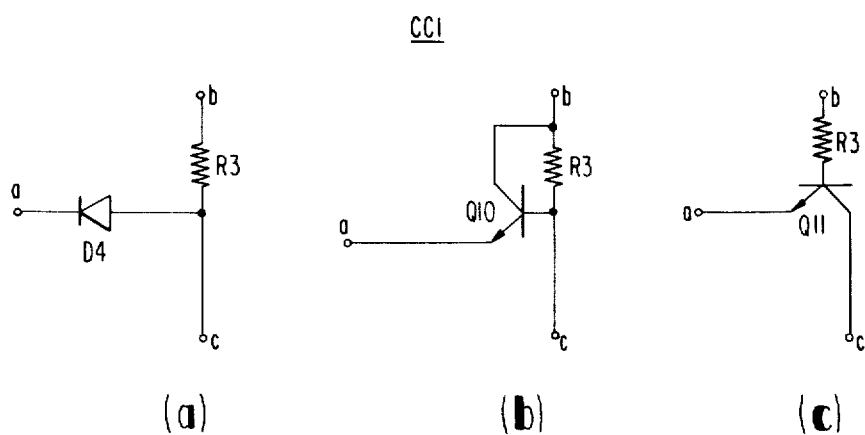
FIGS. 4(a) to (c) are diagrams showing other examples of a circuit CCI of the circuit shown in FIG. 3, respectively.

Incidentally, although the diode D4 is exemplified as a drive current circuit CC1 in FIG. 3, it is a mere example. As the drive current circuit CC1, those in FIGS. 4(a) to (c) may be similarly used.

According to this embodiment, as shown in a characteristic curve CP in FIG. 5, even if the potential V(Q) of the output Q assumes a considerably deep negative value, the potential V($\bar{Q}$) of the output $\bar{Q}$ is never inverted.

Another embodiment of the present invention will be described in the following with reference to FIG. 6. This embodiment corresponds to the circuit in FIG. 2.

Figure 6:
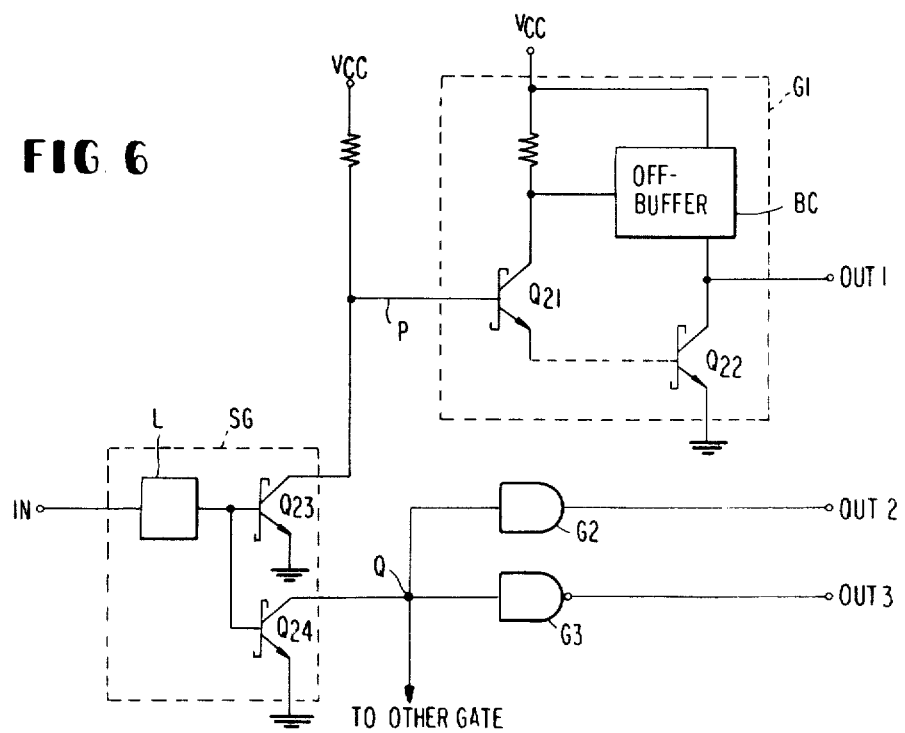
FIG. 6 is a diagram showing another embodiment of the present invention.

In FIG. 6, the two transistors $Q_{23}$ and $Q_{24}$, which have their bases and emitters connected in parallel, are used as the switching transistor of the signal source. The collector of one transistor $Q_{23}$ is connected to the base of the transistor $Q_{21}$ in the base input type logic gate G1 the next stage while to the input terminals other than the base input type gate G1 are connected the collector of the other transistor $Q_{24}$.

By effecting the above connection, as shown in FIG. 6, the transistors $Q_{23}$ and $Q_{24}$ are rendered non-conductive in response to the input signal IN so that the potentials $V_P$ and $V_Q$ respectively at the points P and Q assume high levels. Consequently, when the output OUT1 is at the low level, the output OUT2 is at the high level and the output OUT3 is at the low level, if the low level of the output of the base input type gate G1 having is shifted to the level $V_x$ lower than 0 volts. Then, even if the potential at the point P is reduced by $V_{BE}(Q_{22}) - (V_x + V_{clamp})$, no influence is exerted upon the input terminal Q of the gates G2 and G3.

As has been described hereinbefore, according to the present invention, the abnormal potential $V_x$, which takes place at the low level of the output of the gate circuit having the base input structure, exerts no influence upon the output condition of the other input transistors, which are controlled by the same signal, so that the erroneous operation of the logic circuit can be obviated. Incidentally, the circuits thus exemplified present mere examples but should never restrict the scope of the present invention. In the foregoing embodiments, moreover, although the output for the next step circuits is extracted from the transistor of the signal generating circuit, it may extracted from the emitter in place of the collector.

I claim:

1. A logic circuit comprising a current source, first and second transistors, emitters of said first and second transistors being coupled to said current source in common, first means for operatively supplying a base of said first transistor with a reference voltage, a value of said reference voltage making said first transistor conductive, second means coupled to a collector of said second transistor and responsive to a conducting state of said second transistor for inhibiting said first means from supplying said reference voltage thereby to make said first transistor non-conducting, a third transistor having an emitter coupled to the emitter of said second transistor and a base coupled to the base of said second transistor, third means for applying an input signal to the bases of said second and third transistors in common, a first logic circuit coupled to a collector of said third transistor and controlled by the conducting state of said third transistor, and a second logic circuit coupled to a collector of said first transistor and controlled by the conducting state of said first transistor.

2. The circuit according to claim 1, in which said first logic circuit includes a first input transistor receiving at its base a signal derived from said third transistor.

3. The circuit according to claim 2, further comprising first and second output terminals respectively coupled to said first and second logic circuits.

4. The circuit according to claim 3, said circuit further comprising a first power supply terminal comprising said operating voltage source and a second power supply terminal, in which said first means includes a series circuit having an impedance element and a current source transistor coupled between said first and second power supply terminals and a circuit connection for coupling an intermediary point of said series circuit and the base of said first transistor.

5. The circuit according to claim 4, in which said second means includes a diode coupled between an intermediary point of said series circuit and the collector of said second transistor.

6. A logic circuit further comprising an input terminal, a first output terminal, a second output terminal, a first switching transistor, a second switching transistor, means coupled to said input terminal for applying an input logic signal to bases of said first and second switching transistors in common, an emitter of said first switching transistor being coupled to an emitter of said second switching transistor, a first logic gate having a first input and coupled to a collector of said first switching transistor and a first output end connected to said first output terminal, said first logic gate including an input transistor having a base connected to said first input end and controlled by said first switching transistor, and a second logic gate having a second input end coupled to a collector of said second switching transistor and a second output end connected to said second output terminal, said second logic gate being independent from the output of said first logic gate at said first output end and controlled by said second switching transistor.

7. The circuit according to claim 6, further comprising a third logic gate receiving the signal derived from said second switching transistor.

8. The circuit according to claim 7, further comprising a first output terminal coupled to said first logic gate, a second output terminal coupled to said second logic gate and a third output terminal coupled to said third logic gate.

9. The circuit according to claim 6, in which said second logic gate includes an input transistor receiving at its emitter a signal derived from said second switching transistor.

* * * * *